US012464934B2

United States Patent
Lee et al.

(10) Patent No.: US 12,464,934 B2
(45) Date of Patent: Nov. 4, 2025

(54) LOW REFLECTION FILM FOR QD-OLED PANEL

(71) Applicant: Dell Products L.P., Round Rock, TX (US)

(72) Inventors: Bongjun Lee, Singapore (SG); Guentaek Oh, Singapore (SG); Jeongki Kim, Singapore (SG)

(73) Assignee: Dell Products L.P., Round Rock, TX (US)

(*) Notice: Subject to any disclaimer, the term of this patent is extended or adjusted under 35 U.S.C. 154(b) by 717 days.

(21) Appl. No.: 17/863,469

(22) Filed: Jul. 13, 2022

(65) Prior Publication Data
US 2024/0023368 A1   Jan. 18, 2024

(51) Int. Cl.
*H10K 50/86* (2023.01)
*H10K 59/38* (2023.01)

(52) U.S. Cl.
CPC ............. *H10K 50/86* (2023.02); *H10K 59/38* (2023.02)

(58) Field of Classification Search
CPC ................................ H10K 50/86; H10K 59/38
See application file for complete search history.

(56) References Cited

U.S. PATENT DOCUMENTS

| | | | |
|---|---|---|---|
| 11,275,201 B2 | 3/2022 | Aurongzeb | |
| 11,315,989 B2* | 4/2022 | Aurongzeb | H10K 50/86 |
| 2019/0384110 A1* | 12/2019 | Tanaka | H10K 59/35 |
| 2021/0407410 A1 | 12/2021 | Aurongzeb et al. | |
| 2022/0102445 A1 | 3/2022 | Aurongzeb et al. | |
| 2022/0269092 A1* | 8/2022 | Song | G02B 5/3016 |
| 2022/0367839 A1* | 11/2022 | Huang | H10K 50/86 |

* cited by examiner

*Primary Examiner* — Mary Ellen Bowman
(74) *Attorney, Agent, or Firm* — Larson Newman, LLP

(57) ABSTRACT

A composite film for a quantum dot—organic light emitting diode (QD-OLED) display panel of an information handling system includes a polarizer film, a quarter wavelength retarder film, and a reflective polarizer film. The polarizer film reduces ambient light reflections within the QD-OLED display panel. The quarter wavelength retarder film is in physical communication with the polarizer film. The quarter wavelength retarder film combines with the polarizer film to reduce the ambient light reflections. The reduction of the ambient light reflections increases a contrast ratio for the QD-OLED display panel. The reflective polarizer film is in physical communication with the quarter wavelength retarder film. The reflective polarizer film increases a luminance of the QD-OLED display panel to a first value that is greater than a second value of the luminance created by the polarizer film and the quarter wavelength retarder film.

19 Claims, 6 Drawing Sheets

1000

1100

LOW REFLECTION FILM FOR QD-OLED PANEL

FIELD OF THE DISCLOSURE

The present disclosure generally relates to information handling systems, and more particularly relates to a low reflection film for a QD-OLED panel.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs, and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A composite film for a quantum dot—organic light emitting diode (QD-OLED) display panel of an information handling system includes a polarizer film, a quarter wavelength retarder film, and a reflective polarizer film. The polarizer film may reduce ambient light reflections within the QD-OLED display panel. The quarter wavelength retarder film is in physical communication with the polarizer film. The quarter wavelength retarder film may combine with the polarizer film to reduce the ambient light reflections. The reduction of the ambient light reflections may increase a contrast ratio for the QD-OLED display panel. The reflective polarizer film is in physical communication with the quarter wavelength retarder film. The reflective polarizer film may increase a luminance of the QD-OLED display panel to a first value that is greater than a second value of the luminance created by the polarizer film and the quarter wavelength retarder film.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
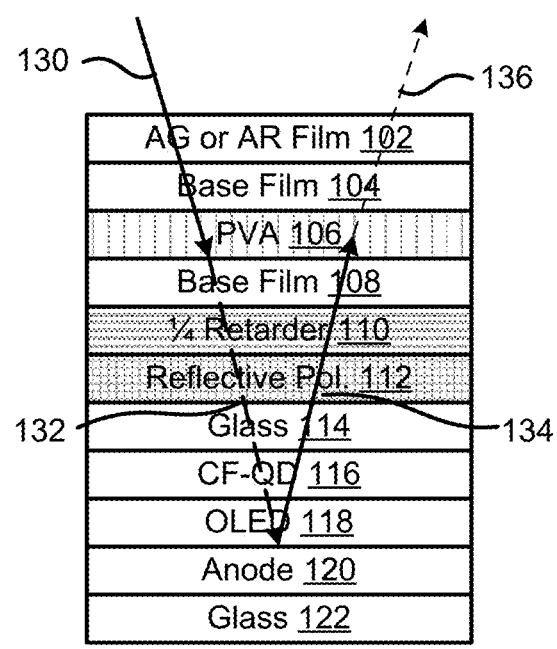
FIGS. 1 and 2 are diagrams of a portion of a display panel of an information handling system according to at least one embodiment of the present disclosure.
Figure 2:
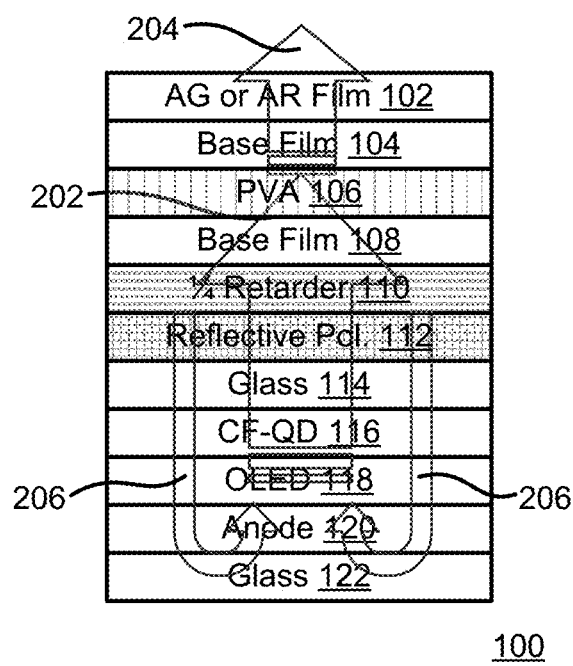

FIGS. 1 and 2 illustrate a portion of a display panel 100 for an information handling system according to an embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device such as a personal digital assistant (PDA) or smart phone, blade server or rack server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 12:
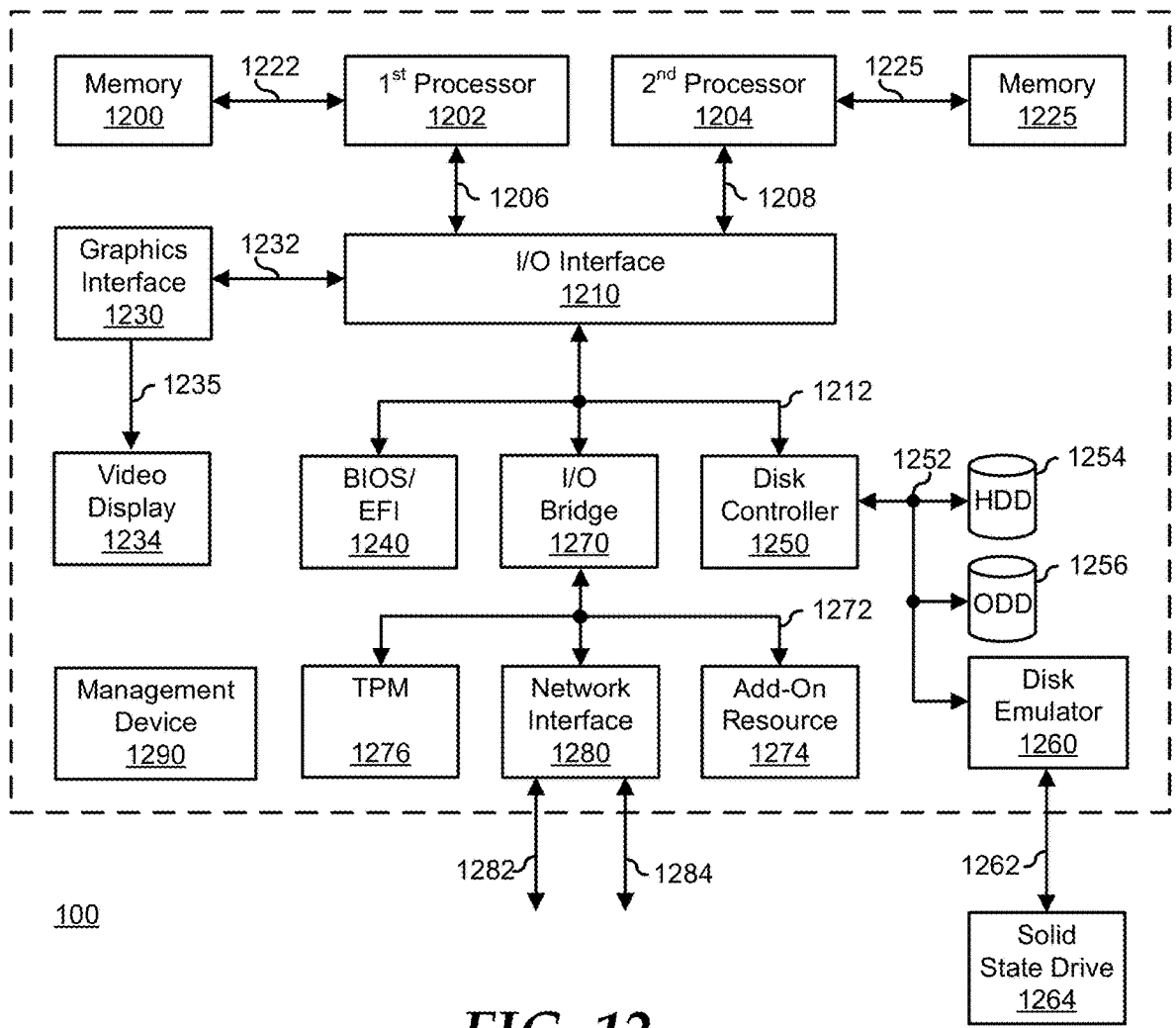
FIG. 12 is a block diagram of a general information handling system according to an embodiment of the present disclosure.

Display panel 100 may be utilized in any suitable display device, such as video display 1234 of FIG. 12. Display panel 100 includes an anti-glare (AG) or anti-reflection (AR) film 102, a base film 104, a patterned vertical alignment (PVA) film 106, a base film 108, a quarter wavelength retarder 110, a reflective polarizer 112, a front glass 114, a color filter (CF)—quantum dot (QD) panel 116, an organic light emitting diode (OLED) panel 118, an anode 120, and a back glass 122. In an example, front glass 114, CF-QD panel 116, OLED panel 118, anode 120, and glass 122 may combine to form an image producing portion of display panel 100. In an example, AG or AR film 102, base film 104, PVA film 106, base film 108, quarter wavelength retarder 110, and reflective polarizer 112 may combine to form a composite film in physical communication with the image producing portion to varying and improve image quality for the images from the image producing portion of display panel 100. The combination of components forming the image producing portion of display panel 100, such as front glass 114, CF-QD panel 116, OLED panel 118, anode 120, and glass 122, may operate in a substantially similar manner to a QD-OLED display know to those of ordinary skill in the art. As such, the operations of front glass 114, CF-QD panel 116, OLED panel 118, anode 120, and glass 122 will not be described herein except as needed to describe embodiments of the present disclosure.

Previous QD-OLED display panels had a lower contrast ratio than other display panels, such as LCD panels, at different ambient luminance. For example, previous QD-OLED display panels may have a lower contrast ratio when the ambient luminance is above 200 nits. These previous QD-OLED display panels may have a slight increase in contrast ratio by application of AG or AR film. However, these QD-OLED display panels still may have a substantially lower contrast ratio as compared to of OLED display panels. In a particular example, QD-OLED display panels may have a lower contrast ratio than LCD and white OLED (WOLED) based on a higher reflection value for the OLED.

In an example, QD-OLED display panel 100 may be improved by a combination of PVA 106, quarter wavelength retarder 110, and reflective polarizer 112 to increase the contrast ratio for the QD-OLED display panel. Additionally, QD-OLED display panel 100 may also be improved by adding a prism sheet, such as prism sheet 314 of FIG. 3, to increase the luminance of the QD-OLED display panel. As will be described herein, QD-OLED display panel 100 may have an improved ambient contrast ratio while having a reduction in reflection as compared to previous QD-OLED display panels. In certain examples, the improved or increased ambient contrast ratio may be implemented based on PVA 106, quarter wavelength retarder 110, reflective polarizer 112 being added to front glass 114 of QD-OLED display panel 100. In other examples, the improved or increased ambient contrast ratio may be also implemented by the addition of prism sheets on front glass 114, creation of a composite film for reducing reflection, omission of base film 108 and haze treatments, or the like.

In certain examples, base film 104, PVA 106, and base film 108 may form a polarizer to reduce internal reflections within QD-OLED display panel 100. In an example, the polarizer formed by base film 104, PVA 106, and base film 108 may reduce internal reflections by any suitable amount, such as 35%, 40%, 45%, or the like. Additionally, the addition of quarter wavelength retarder 110 to the polarizer of base film 104, PVA 106, and base film 108 may further reduce internal reflections to any suitable amount, such as 80% or the like. As shown in FIG. 1, as ambient light travels into QD-OLED display panel 100 in the direction of arrow 130, the polarizer formed by base film 104, PVA 106, and base film 108 and quarter wavelength retarder 110 may reduce an intensity or luminance of the ambient light as indicated by the dash line 132. This ambient light may then reflect off OLED panel 118 as illustrated by arrow 134. When the reflected ambient light travels through the polarizer formed by base film 104, PVA 106, and base film 108 and quarter wavelength retarder 110, the reflected light may again be reduced as illustrated by dashed arrow 136. However, while the reduction of the reflected light may increase the contrast ratio of QD-OLED display panel 100, the polarizer formed by base film 104, PVA 106, and base film 108 may also reduce the luminance of the light from OLED panel 118 and CF-QD panel 116 to any suitable amount, such as less than 43%, 44%, 45%, 46%, or the like of the original luminance.

Referring now to FIG. 2, arrow 202 may illustrate the light produced by OLED panel 118 and CF-QD panel 116, and arrow 204 may illustrate a reduced amount of light after the produced light travels through the polarizer formed by base film 104, PVA 106, and base film 108. In an example, reflective polarizer 112 may be placed in physical communication with front glass 114 to increase the luminance of the produced light traveling along arrow 202 from OLED panel 118 and CF-QD panel 116 to the polarizer formed by base film 104, PVA 106, and base film 108. Reflective polarizer 112 may be any suitable reflective polarizer including, but not limited to, a dual-brightness enhancement film (DBEF). In an example, reflective polarizer 112 may increase the luminance of the produced light via polarization recycling. For example, the light traveling in the direction of arrow 202 may include two polarized light sources. Reflective polarizer 112 may let one polarized light source travel through the reflective polarizer and may reflect the second polarized light as illustrated by arrows 206. The reflected polarized light along arrows 206 may be recycled into both polarized light sources, which in turn are added to the light traveling along arrow 202. In this situation, the additional recycled light may increase the luminance to any suitable amount. In an non-limited example, if the polarizer formed by base film 104, PVA 106, and base film 108 reduces the luminance to 45%, the addition of reflective polarizer 112 may increase the luminance from the 45% to 75% of the originally produced luminance.

Figure 3:
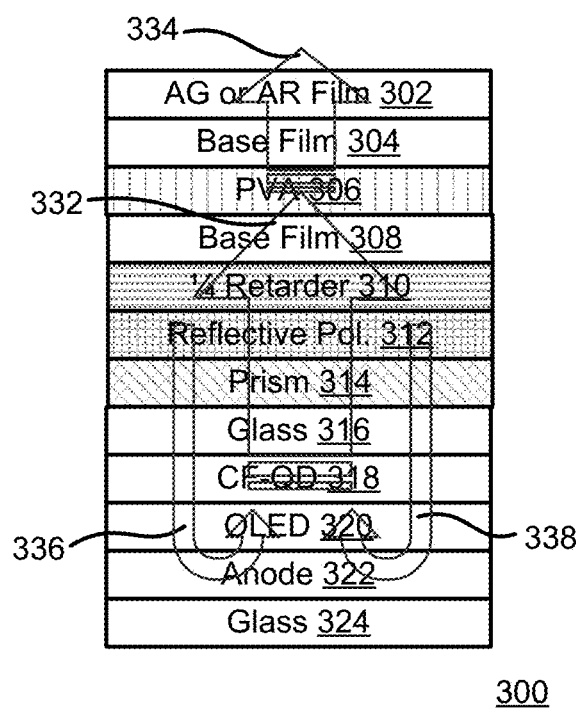
FIG. 3 is a diagram of a portion of another display panel of an information handling system according to at least one embodiment of the present disclosure.

FIG. 3 illustrates a portion of a display panel 300 of an information handling system according to at least one embodiment of the present disclosure. Display panel 300 may be utilized in any suitable display device, such as video display 1234 of FIG. 12. Display panel 300 includes an AG or AR film 302, a base film 304, a PVA film 306, a base film 308, a quarter wavelength retarder 310, a reflective polarizer 312, a front glass 314, a CF-QD panel 316, an OLED panel 318, an anode 320, and a back glass 322. In an example, front glass 314, CF-QD panel 316, OLED panel 318, anode 320, and glass 322 may combine to form an image producing portion of display panel 300. In an example, AG or AR film 302, base film 304, PVA film 306, base film 308, quarter wavelength retarder 310, and reflective polarizer 312 may combine to form a composite film in physical communication with the image producing portion to varying and improve image quality for the images from the image producing portion of display panel 300. The combination of components forming the image producing portion of display panel 300, such as front glass 314, CF-QD panel 316, OLED panel 318, anode 320, and glass 322, may operate in a substantially similar manner to a QD-OLED display know to those of ordinary skill in the art. As such, the operations of front glass 314, CF-QD panel 316, OLED panel 318, anode 320, and glass 322 will not be described herein except as needed to describe embodiments of the present disclosure.

In an example, the polarizer formed by base film 304, PVA 306, and base film 308 may perform in a substantially similar manner as the polarizer formed by base film 104, PVA 106, and base film 108 of FIGS. 1 and 2 to reduce internal reflections by any suitable amount, such as 35%, 40%, 45%, or the like. Additionally, the addition of quarter wavelength retarder 310 to the polarizer of base film 304, PVA 306, and base film 308 may further reduce internal reflections to any suitable amount, such as 80% or the like.

In certain examples, arrow 332 may illustrate the light produced by OLED panel 318 and CF-QD panel 316, and arrow 334 may illustrate a reduced amount of light after the produced light travels through the polarizer formed by base film 304, PVA 306, and base film 308. In an example, reflective polarizer 312 may be placed in physical communication with front glass 314 to increase the luminance of the produced light traveling along arrow 332 from OLED panel 318 and CF-QD panel 316 to the polarizer formed by base film 304, PVA 306, and base film 308 via the reflected light along arrows 336. In an example, prism sheet 314 may be utilized to converge the produced and reflected light to increase the brightness of QD-OLED display panel 300 to any suitable amount in a range of viewing angles. In a non-limited example, reflective polarizer 312 and prism sheet 314 may increase the luminance of the produced light to a value of over 100% of the luminance from OLED panel 320 and CF-QD panel 318.

Figure 4:
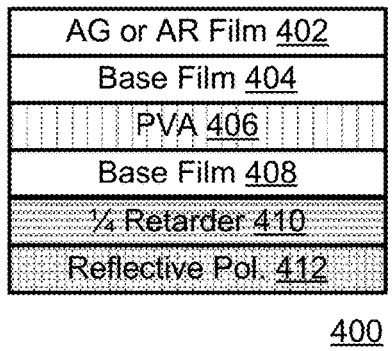
FIGS. 4-9 are diagrams of portions of different composite films for a display panel of an information handling system according to at least one embodiment of the present disclosure.

FIGS. 4-9 show different composite films 400, 500, 600, 700, 800, and 900 for a display panel, such as video display 1234 of FIG. 12, of an information handling system according to at least one embodiment of the present disclosure. Referring to FIG. 4, composite film 400 includes an AG or AR film 402, a base film 404, a PVA film 406, a base film 408, a quarter wavelength retarder 410, and a reflective polarizer 412. In an example, composite film components AG or AR film 402, base film 404, PVA film 406, base film 408, quarter wavelength retarder 410, and reflective polarizer 412 may function as described above with respect to FIGS. 1 and 2 to improve the contrast ratio of a QD-OLED display panel while not greatly reducing the luminance of the QD-OLED display panel.

Figure 5:
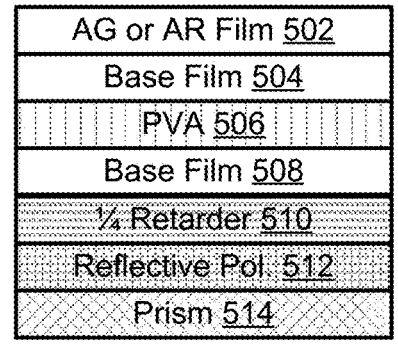

Referring to FIG. 5, composite film 500 includes an AG or AR film 502, a base film 504, a PVA film 506, a base film 508, a quarter wavelength retarder 510, a reflective polarizer 512, and one or more prism sheets 514. In an example, composite film components AG or AR film 502, base film 504, PVA film 506, base film 508, quarter wavelength retarder 510, reflective polarizer 512, and prism sheets 514 may function as described above with respect to FIG. 3 to improve the contrast ratio of a QD-OLED display panel while also increasing the luminance of the QD-OLED display panel.

Figure 6:
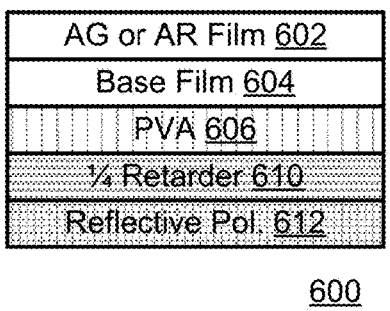

Referring to FIG. 6, composite film 600 includes an AG or AR film 602, a base film 604, a PVA film 606, a quarter wavelength retarder 610, and a reflective polarizer 612. In an example, the removal of a base film from composite film components AG or AR film 602, base film 604, PVA film 606, quarter wavelength retarder 610, and reflective polarizer 612 may improve the quality, performance, and process efficiency of composite film 600 while increasing the contrast ratio of a QD-OLED display panel while also increasing the luminance of the QD-OLED display panel.

Figure 7:
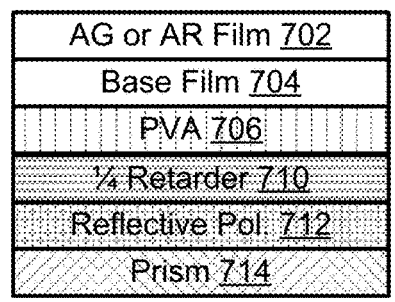

Referring to FIG. 7, composite film 700 includes an AG or AR film 702, a base film 704, a PVA film 706, a quarter wavelength retarder 710, a reflective polarizer 712, and one or more prism sheets 714. In an example, the removal of a base film from composite film components AG or AR film 702, base film 704, PVA film 706, quarter wavelength retarder 710, reflective polarizer 712, and prism sheets 714 may improve the quality, performance, and process efficiency of composite film 700 while increasing the contrast ratio of a QD-OLED display panel while also increasing the luminance of the QD-OLED display panel.

Figure 8:
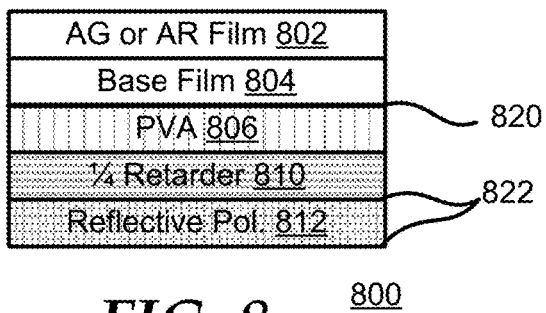

Referring to FIG. 8, composite film 800 includes an AG or AR film 802, a base film 804, a PVA film 806, a quarter wavelength retarder 810, and a reflective polarizer 812. In an example, composite film components AG or AR film 802, base film 804, PVA film 806, base film 808, quarter wavelength retarder 810, and reflective polarizer 810 may function as described above with respect to FIGS. 1 and 2 to improve the contrast ratio of a QD-OLED display panel while not greatly reducing the luminance of the QD-OLED display panel.

Composite film 800 includes a haze treatment 820 between base film 804 and PVA film 806, and an omission of haze treatments on the surfaces 822 of reflective polarizer 812. In an example, haze treatment 820 may reduce transmission haze at the intersection between base film 804 and PVA film 806. In this example, haze treatment 820 may improve the quality, performance, and process efficiency of composite film 800. In an example, the omission of haze treatments on the surfaces 822 of reflective polarizer 812 may increase the reflect haze within reflective polarizer 812. In this example, the omission of haze treatments on the surfaces 822 may improve the quality, performance, and process efficiency of composite film 800 by increasing the luminance of the associated QD-OLED display panel.

Figure 9:
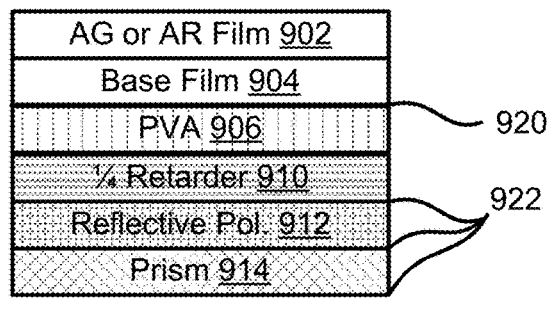

Referring to FIG. 9, composite film 900 includes an AG or AR film 902, a base film 904, a PVA film 906, a quarter wavelength retarder 910, a reflective polarizer 912, and one or more prism sheets 914. In an example, composite film components AG or AR film 902, base film 904, PVA film 906, quarter wavelength retarder 910, reflective polarizer 912, and prism sheets 914 may function as described above with respect to FIG. 3 to improve the contrast ratio of a QD-OLED display panel while also increasing the luminance of the QD-OLED display panel.

Composite film 900 includes a haze treatment 920 between base film 904 and PVA film 906, and an omission of haze treatments on surfaces 922 of reflective polarizer 912 and prism sheets 914. In an example, haze treatment 920 may reduce transmission haze at the intersection between base film 904 and PVA film 906. In this example, haze treatment 920 may improve the quality, performance, and process efficiency of composite film 900. In an example, the omission of haze treatments on the surfaces 922 of reflective polarizer 912 and prism sheets 914 may increase the reflect haze within reflective polarizer 912, and decrease the transmission haze through prism sheets 914. In this example, the omission of haze treatments on the surfaces 922 may improve the quality, performance, and process efficiency of composite film 900 by increasing the luminance of the associated QD-OLED display panel.

Figure 10:
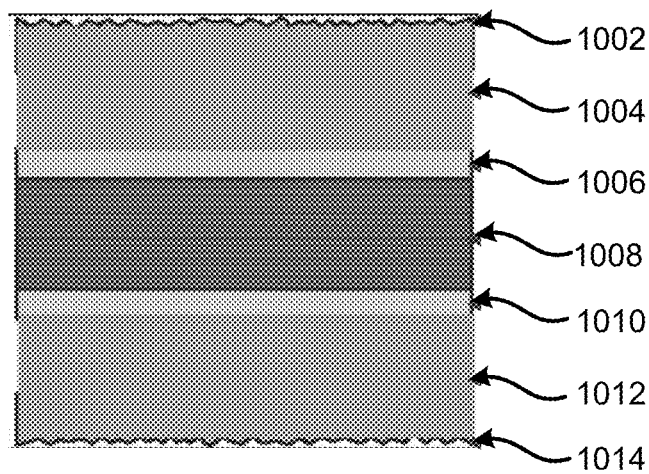
FIG. 10 is a diagram of a portion of a reflective polarizer film structure for a display panel of an information handling system according to at least one embodiment of the present disclosure.

FIG. 10 is a diagram of a portion of a reflective polarizer film structure 1000 for a display panel of an information handling system according to at least one embodiment of the present disclosure. Reflective polarizer film structure 100 includes a haze treatment 1002, a base film 1004, an adhesive layer 1006, a core film 1008, an adhesive layer 1010, a base film 1012, and a haze treatment 1014. In an example, the components base film 1004, adhesive layer 1006, core film 1008, adhesive layer 1010, and base film 1012 may form reflective polarizer film structure 1000. In certain examples, haze treatments 1002 and 1014 may be included in or omitted from reflective polarizer film structure 1000 based on particular desired characteristics of the reflective polarizer film structure as described above.

Figure 11:
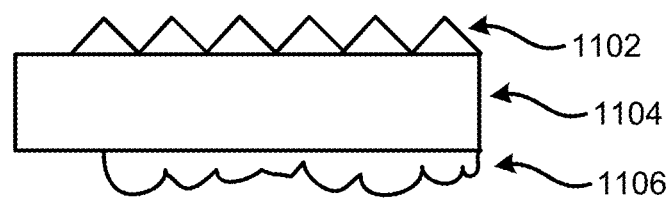
FIG. 11 is a diagram of a portion of a prism sheet for a display panel of an information handling system according to at least one embodiment of the present disclosure.

FIG. 11 shows a portion of a prism sheet 1100 for a display panel of an information handling system according to at least one embodiment of the present disclosure. Prism sheet 1100 includes a prism 1102, a base film 1104, and a haze treatment 1106. In an example, prisms 1102 may be utilized to converge light to increase the brightness of a QD-OLED display panel to any suitable amount in a range of viewing angles. Haze treatment 1106 may be may be included in or omitted from prism sheet 1100 based on particular desired characteristics of the reflective polarizer film structure as described above.

FIG. 12 shows a generalized embodiment of an information handling system 1200 according to an embodiment of the present disclosure. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 1200 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 1200 can include processing resources for executing machine-executable code, such as a central processing unit (CPU), a programmable logic array (PLA), an embedded device such as a System-on-a-Chip (SoC), or other control logic hardware. Information handling system 1200 can also include one or more computer-readable medium for storing machine-executable code, such as software or data. Additional components of information handling system 1200 can include one or more storage devices that can store machine-executable code, one or more communications ports for communicating with external devices, and various input and output (I/O) devices, such as a keyboard, a mouse, and a video display. Information handling system 1200 can also include one or more buses operable to transmit information between the various hardware components.

Information handling system 1200 can include devices or modules that embody one or more of the devices or modules described below and operates to perform one or more of the methods described below. Information handling system 1200 includes a processors 1202 and 1204, an input/output (I/O) interface 1210, memories 1220 and 1225, a graphics interface 1230, a basic input and output system/universal extensible firmware interface (BIOS/UEFI) module 1240, a disk controller 1250, a hard disk drive (HDD) 1254, an optical disk drive (ODD) 1256, a disk emulator 1260 connected to an external solid state drive (SSD) 1262, an I/O bridge 1270, one or more add-on resources 1274, a trusted platform module (TPM) 1276, a network interface 1280, a management device 1290, and a power supply 1295. Processors 1202 and 1204, I/O interface 1210, memory 1220, graphics interface 1230, BIOS/UEFI module 1240, disk controller 1250, HDD 1254, ODD 1256, disk emulator 1260, SSD 1262, I/O bridge 1270, add-on resources 1274, TPM 1276, and network interface 1280 operate together to provide a host environment of information handling system 1200 that operates to provide the data processing functionality of the information handling system. The host environment operates to execute machine-executable code, including platform BIOS/UEFI code, device firmware, operating system code, applications, programs, and the like, to perform the data processing tasks associated with information handling system 1200.

In the host environment, processor 1202 is connected to I/O interface 1210 via processor interface 1206, and processor 1204 is connected to the I/O interface via processor interface 1208. Memory 1220 is connected to processor 1202 via a memory interface 1222. Memory 1225 is connected to processor 1204 via a memory interface 1227. Graphics interface 1230 is connected to I/O interface 1210 via a graphics interface 1232 and provides a video display output 1236 to a video display 1234. In a particular embodiment, information handling system 1200 includes separate memories that are dedicated to each of processors 1202 and 1204 via separate memory interfaces. An example of memories 1220 and 1230 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 1240, disk controller 1250, and I/O bridge 1270 are connected to I/O interface 1210 via an I/O channel 1212. An example of I/O channel 1212 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 1210 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 1240 includes BIOS/UEFI code operable to detect resources within information handling system 1200, to provide drivers for the resources, initialize the resources, and access the resources. BIOS/UEFI module 1240 includes code that operates to detect resources within information handling system 1200, to provide drivers for the resources, to initialize the resources, and to access the resources.

Disk controller 1250 includes a disk interface 1252 that connects the disk controller to HDD 1254, to ODD 1256, and to disk emulator 1260. An example of disk interface 1252 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 1260 permits SSD 1264 to be connected to information handling system 1200 via an external interface 1262. An example of external interface 1262 includes a USB interface, an IEEE 3394 (Firewire) interface, a proprietary interface, or a combination thereof. Alternatively, solid-state drive 1264 can be disposed within information handling system 1200.

I/O bridge 1270 includes a peripheral interface 1272 that connects the I/O bridge to add-on resource 1274, to TPM 1276, and to network interface 1280. Peripheral interface 1272 can be the same type of interface as I/O channel 1212 or can be a different type of interface. As such, I/O bridge 1270 extends the capacity of I/O channel 1212 when peripheral interface 1272 and the I/O channel are of the same type, and the I/O bridge translates information from a format suitable to the I/O channel to a format suitable to the peripheral channel 1272 when they are of a different type. Add-on resource 1274 can include a data storage system, an additional graphics interface, a network interface card (NIC), a sound/video processing card, another add-on resource, or a combination thereof. Add-on resource 1274 can be on a main circuit board, on separate circuit board or add-in card disposed within information handling system 1200, a device that is external to the information handling system, or a combination thereof.

Network interface 1280 represents a NIC disposed within information handling system 1200, on a main circuit board of the information handling system, integrated onto another component such as I/O interface 1210, in another suitable location, or a combination thereof. Network interface device 1280 includes network channels 1282 and 1284 that provide interfaces to devices that are external to information handling system 1200. In a particular embodiment, network channels 1282 and 1284 are of a different type than peripheral channel 1272 and network interface 1280 translates information from a format suitable to the peripheral channel to a format suitable to external devices. An example of network channels 1282 and 1284 includes InfiniBand channels, Fibre Channel channels, Gigabit Ethernet channels, proprietary channel architectures, or a combination thereof. Network channels 1282 and 1284 can be connected to external network resources (not illustrated). The network resource can include another information handling system, a data storage system, another network, a grid management system, another suitable resource, or a combination thereof.

Management device 1290 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 1200. In particular, management device 1290 is connected to various components of the host environment via various internal communication interfaces, such as a Low Pin Count (LPC) interface, an Inter-Integrated-Circuit (I2C) interface, a PCIe interface, or the like, to provide an out-of-band (00B) mechanism to retrieve information related to the operation of the host environment, to provide BIOS/UEFI or system firmware updates, to manage non-processing components of information handling system 1200, such as system cooling fans and power supplies. Management device 1290 can include a network connection to an external management system, and the management device can communicate with the management system to report status information for information handling system 1200, to receive BIOS/UEFI or system firmware updates, or to perform other task for managing and controlling the operation of information handling system 1200.

Management device 1290 can operate off of a separate power plane from the components of the host environment so that the management device receives power to manage information handling system 1200 when the information handling system is otherwise shut down. An example of management device 1290 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 1290 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. A composite film for a quantum dot-organic light emitting diode (QD-OLED) display panel of an information handling system, the composite film comprising:
 a polarizer film to reduce ambient light reflections within the QD-OLED display panel,
  wherein the polarizer film includes:
  a first base film; and
  a patterned vertical alignment film in physical communication with the first base film;
 a quarter wavelength retarder film in physical communication with the polarizer film, the quarter wavelength retarder film to combine with the polarizer film to reduce the ambient light reflections, wherein the reduction of the ambient light reflections increases a contrast ratio for the QD-OLED display panel; and
 a reflective polarizer film in physical communication with the quarter wavelength retarder film, the reflective polarizer film to increase a luminance of the QD-OLED display panel to a first value that is greater than a second value of the luminance created by the polarizer film and the quarter wavelength retarder film.

2. The composite film of claim 1, further comprising a prism sheet in physical communication with the reflective polarizer film, the prism sheet to further increase the luminance of the QD-OLED display panel to a third value.

3. The composite film of claim 1, further comprising a haze treatment on the patterned vertical alignment film, wherein the haze treatment increases the reduction of the ambient light reflections within the QD-OLED display panel.

4. The composite film of claim 1, wherein the polarizer film further includes a second base film, wherein the patterned vertical alignment film is in physical communication with both the first and second base films and located in between the first and second base films.

5. The composite film of claim 1, wherein the increase of the contrast ratio for the QD-OLED display panel is when a luminance of ambient light is above a predetermined value.

6. The composite film of claim 1, further comprising an anti-glare film in physical communication with first base film.

7. The composite film of claim 1, further comprising an anti-reflection film in physical communication with first base film.

8. A quantum dot-organic light emitting diode (QD-OLED) display panel of an information handling system, the QD-OLED display panel comprising:
   an OLED panel;
   a color filter (CF)-quantum dot (QD) panel in physical communication with the OLED panel;
   a front glass in physical communication with the CF-QD panel; and
   a composite film in physical communication with the front glass, the composite film including:
      a polarizer film to reduce ambient light reflections within the QD-OLED display panel;
      a quarter wavelength retarder film in physical communication with the polarizer film, the quarter wavelength retarder film to combine with the polarizer film to reduce the ambient light reflections, wherein the reduction of the ambient light reflections increases a contrast ratio for the QD-OLED display panel; and
      a reflective polarizer film in physical communication with the quarter wavelength retarder film, the reflective polarizer film to increase a luminance of the QD-OLED display panel to a first value that is greater than a second value of the luminance created by the polarizer film and the quarter wavelength retarder film.

9. The QD-OLED display panel of claim 8, wherein the composite film further includes a prism sheet in physical communication with the reflective polarizer film, the prism sheet to further increase the luminance of the QD-OLED display panel to a third value.

10. The QD-OLED display panel of claim 8, wherein the polarizer film includes:
   a first base film; and
   a patterned vertical alignment film in physical communication with the first base film.

11. The QD-OLED display panel of claim 10, wherein the composite film further includes a haze treatment on the patterned vertical alignment film, wherein the haze treatment increases the reduction of the ambient light reflections within the QD-OLED display panel.

12. The QD-OLED display panel of claim 10, wherein the polarizer film further includes a second base film, wherein the patterned vertical alignment film is in physical communication with both the first and second base films and located in between the first and second base films.

13. The QD-OLED display panel of claim 8, wherein the increase of the contrast ratio for the QD-OLED display panel is when a luminance of ambient light is above a predetermined value.

14. The QD-OLED display panel of claim 10, wherein the composite film further includes an anti-glare film in physical communication with first base film.

15. The QD-OLED display panel of claim 10, wherein the composite film further includes an anti-reflection film in physical communication with first base film.

16. A quantum dot-organic light emitting diode (QD-OLED) display panel of an information handling system, the QD-OLED display panel comprising:
   an OLED panel;
   a color filter (CF)-quantum dot (QD) panel, the CF-QD panel in physical communication with the OLED panel;
   a front glass in physical communication with the CF-QD panel; and
   a composite film in physical communication with the front glass, the composite film including:
      a polarizer film to reduce ambient light reflections within the QD-OLED display panel, the polarizer film including:
         a first base film;
         a patterned vertical alignment film in physical communication with the first base film; and
         a haze treatment on the patterned vertical alignment film, wherein the haze treatment increases the reduction of the ambient light reflections within the QD-OLED display panel;
      a quarter wavelength retarder film in physical communication with the polarizer film, the quarter wavelength retarder film to combine with the polarizer film to reduce the ambient light reflections, wherein the reduction of the ambient light reflections increases a contrast ratio for the QD-OLED display panel;
      a reflective polarizer film in physical communication with the quarter wavelength retarder film, the reflective polarizer film to increase a luminance of the QD-OLED display panel to a first value that is greater than a second value of the luminance created by the polarizer film and the quarter wavelength retarder film; and
      a prism sheet in physical communication with the reflective polarizer film, the prism sheet to further increase the luminance of the QD-OLED display panel to a third value.

17. The QD-OLED display panel of claim 16, wherein the polarizer film further includes a second base film, wherein the patterned vertical alignment film is in physical communication with both the first and second base films and located in between the first and second base films.

18. The QD-OLED display panel of claim 16, wherein the composite film further includes an anti-glare film in physical communication with first base film.

19. The QD-OLED display panel of claim 16, wherein the composite film further includes:
   an anti-reflection film in physical communication with first base film.

* * * * *